United States Patent [19]
Meschter et al.

[11] Patent Number: 5,592,021
[45] Date of Patent: Jan. 7, 1997

[54] CLAMP FOR SECURING A POWER DEVICE TO A HEATSINK

[75] Inventors: Stephan J. Meschter, Endicott; Ricky L. Icenogle, Lisle; Glenn Trojnar; William A. Peterson, both of Vestal, all of N.Y.

[73] Assignee: Martin Marietta Corporation, King of Prussia, Pa.

[21] Appl. No.: 428,997

[22] Filed: Apr. 26, 1995

[51] Int. Cl.$^6$ .................................................. H01L 23/34
[52] U.S. Cl. ........................................ 257/727; 257/726
[58] Field of Search ...................................... 257/727, 726

[56] References Cited

U.S. PATENT DOCUMENTS

| | | | |
|---|---|---|---|
| 4,069,497 | 1/1978 | Steidlitz | 357/80 |
| 4,259,685 | 3/1981 | Romano | 257/727 |
| 4,845,590 | 7/1989 | Mikolajczak | 361/386 |
| 5,225,965 | 7/1993 | Bailey et al. | 361/386 |
| 5,321,582 | 6/1994 | Casperson | 361/713 |
| 5,327,324 | 7/1994 | Roth | 361/707 |
| 5,343,362 | 8/1994 | Solberg | 361/710 |
| 5,396,404 | 3/1995 | Murphy et al. | 257/727 |

FOREIGN PATENT DOCUMENTS

| | | | |
|---|---|---|---|
| 0178977 | 9/1985 | European Pat. Off. | 257/675 |
| 2756500 | 12/1977 | Germany | 257/727 |
| 55-26684 | 2/1980 | Japan | 257/726 |

OTHER PUBLICATIONS

Sketch of Heatsink used in DSV Power Converter Model DSA–0302(Taiwan) + picture of unit and Heatsink in situ.
Aavid Engineering, Inc. Catalog 1200, pp. 22, 23, 26–33.
Thermalloy Co.—Heatsink Catalog, pp. 36–41 and 48–49.

*Primary Examiner*—Mahshid Saadat
*Assistant Examiner*—Jhihan Clark
*Attorney, Agent, or Firm*—Brian J. Rees; Geoffrey H. Krauss

[57] ABSTRACT

A clamping system is provided for effectively securing at least one power device in a thermally-conductive and electrically-insulative manner to a heatsink with a clamp member having an elongated member portion adapted to bear against a device, and a second member portion having an end adapted to bear against a heatsink. A fastener exerts a force on the member between the device and the second member portion to force an end of the second member portion into contact with the heatsink, and cause the member portion overlying the device to reciprocally exert a pressure on the device against the heatsink.

11 Claims, 3 Drawing Sheets

5,592,021

CLAMP FOR SECURING A POWER DEVICE TO A HEATSINK

BACKGROUND OF THE INVENTION

The present invention relates to a clamping system and, more particularly, to a system for clamping a power-dissipating device, having an electrically-active and/or thermally-active baseplate to a heatsink structure.

Many power-dissipating devices are provided in packages of a standard style, e.g., type TO-220, TO-218 or TO-247 packages. These devices have packaged high power devices (with or without integrated circuit driver chips) which are disposed on, and in electrical communication with an electrically-active and thermally-active baseplate. This conductive baseplate often has a portion extending out from the die/chip-package which portion has a hole therethrough for securing the device to a heatsink structure. Theoretically, as the securing-screw is tightened, the conductive baseplate will be pulled into intimate contact with the heatsink; however, in practice, as the screw is tightened, the conductive baseplate goes through some deformation whereby a portion of the baseplate is raised away from the heatsink. This separation results in a significant reduction in reliability and increases the resistance of heat transfer from the conductive baseplate to the heatsink, necessitating an enlargement of the actual heatsink in comparison with the theoretical requirement.

This problem is exemplified in FIG. 1, where a package 10 has a metal strip 2 supporting a semiconductor chip 6; where the chip 6 and a portion 2a of the metal strip 2 are encased in a resin housing 4. The exposed strip-portion 2b has an aperture 12, for the passage of a screw 14 securing package 10 to a heatsink 18. Screw 14 is in intimate contact with conductive strip 2 and heatsink 18, thereby electrically connecting the two. As screw 14 is tightened, strip portion 2b near screw 14 contacts the heatsink, but the strip-portion 2a distant from screw, i.e., under housing 4, may (by deformation of the strip and like mechanisms) be elevated out of contact with heatsink 18. When a portion of the package 10 lifts away from the heatsink 18 a significant reduction in heat transfer occurs, leading to a reduction in device reliability due to the increased device junction temperatures.

One prior art solution to the thermal contact problem, taught in accordance with U.S. Pat. No. 4,259,685, entitled "Clamp for Securing An Encased Power Frame to a Heat Sink", is shown in FIG. 2, wherein like reference designations are used for like elements. As shown, a clamp 20 is used to maintain intimate contact between device 10 (including the portion of a conductive strip 2, within resin housing 4, where integrated chip 6 resides) and the heatsink 18. Strip 2 supports chip 6 and has a portion 2b extending beyond housing 4 and having an aperture 12 for facilitating device 10 to be secured to heatsink 18 with screw 14. Clamp 20 has a portion 22 spaced over the exposed strip-portion 2b where screw 14 is placed. Portion 22 has rectangular legs 28 bent down on three sides of strip-portion 2b to contact heatsink 18. The legs 28 define a space which is substantially closed on three sides and is open on the fourth side toward device housing 4. At this fourth side, clamp 20 extends over device 10. Screw 14 passes through an aperture 22a of portion 22 and extends through hole 12 in conductive strip 2. Screw 14 is in intimate contact with portion 22 and heatsink 18, and the metal-legs 28 of base 22 are also in intimate contact with heatsink 18. Therefore, screw 14, base 22, legs 28 and heatsink 12 are in thermal and electrical contact. Moreover, due to the alignment of the screw with the hole within the conductive strip, there is only one configuration in which to place a clamp in relation to the device.

Other difficulties arise when the devices being attached to the heatsink are at some non-ground potential. Since in the standard packages (TO-220, TO-218 or TO-247), the semiconductor device is in electrical contact with its conductive supporting baseplate, if several devices are to be mounted to a common heatsink, and the electrical potential of the devices vary, then each device must be electrically insulated from the heatsink to avoid one device from influencing the operation of another device. However, simultaneous with this electrical insulation, adequate thermal contact must be maintained for proper operation of each device.

Therefore, it is desired to provide a clamping system for flexibly securing power supply devices to a heatsink while maintaining thermal conductivity, and providing electrical insulation, between the device and the heatsink.

OBJECTS OF THE INVENTION

A primary object of the present invention is to provide a novel clamping system for securing power supply devices to a heatsink to ensure adequate thermal contact while allowing the device to operate at a different electrical potential from the heatsink.

SUMMARY OF THE INVENTION

In accordance with the present invention, a clamping system is provided for effectively securing at least one power device with a thermally-active and electrically-active baseplate to a heatsink surface, where the system uses: a unitary clamp member having a first elongated portion with a section adapted to bear against the device, a second portion having an end adapted to bear against the heatsink surface; and a fastening means adapted to exert a force toward the heatsink surface at a location on the first member between the device and the second portion. The fastening means exerts a pressure forcing the second portion into contact with the heatsink, and causing the first portion section overlying the device to reciprocally exert a pressure on the device. The device is secured to the heatsink with a thermally-conductive and electrically-insulative pad placed therebetween to allow thermal energy to transfer between the baseplate and the heatsink while inhibiting electrical communication.

BRIEF DESCRIPTION OF THE DRAWINGS

The subject matter which is regarded as the invention is particularly pointed out and distinctly claimed in the concluding portion of the specification. The invention, together with further objects and advantages thereof, may best be understood by reference to the following description taken in connection with the accompanying drawings in which:

DETAILED DESCRIPTION

Figure 3:
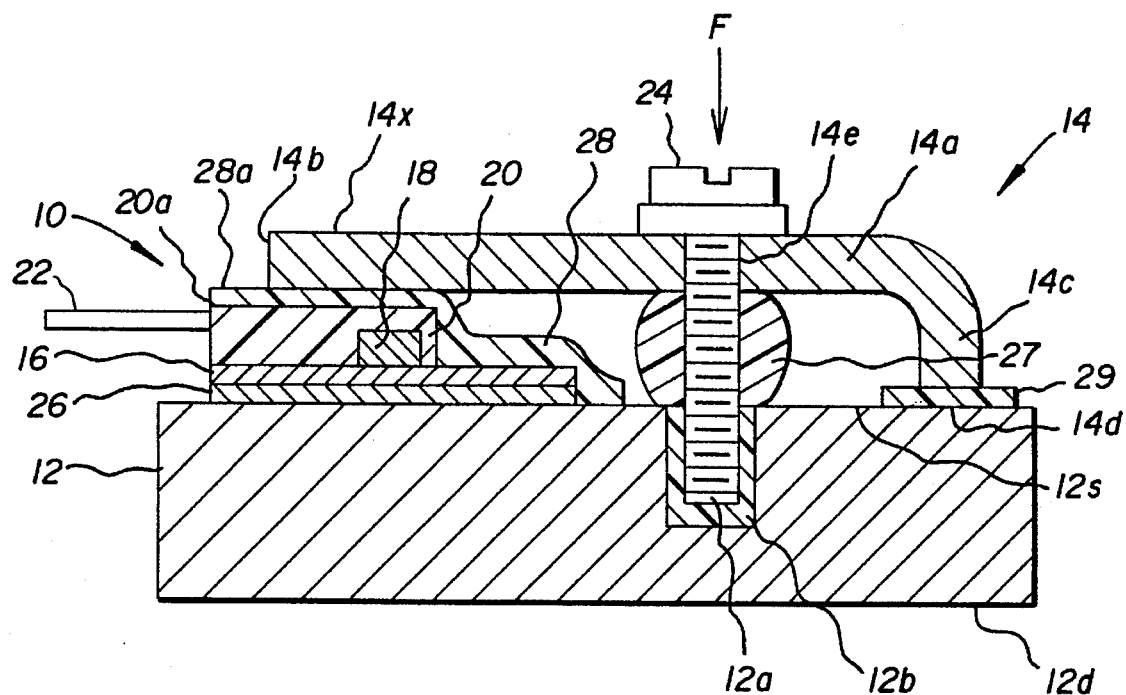
FIG. 3 is a cross-sectional view of a clamp, in accordance with the present invention, for thermally securing a power supply device to a heatsink while ensuring electrical insulation therebetween.

FIG. 3 shows a power supply device 10, held in thermally conductive and electrically insulative contact with a heatsink 12, by a clamp 14. Power supply device 10, of well known type, has an electrically conductive baseplate 16 supporting, and in electrical contact with, a power-dissipating semiconductor chip 18. Chip 18 is encased in a resin block 20 having a top surface 20a. A portion of each of a plurality of conductors 22, which are electrically connected to chip 18, and extending from resin block 20 may connect to a printed circuit board or to other circuit interconnection means (not shown). A thermally-conductive and electrically-insulating pad 26 is disposed between conductive baseplate 16 and heatsink 12 to facilitate thermal communication, and to inhibit electrical communication, therebetween.

In accordance with one preferred embodiment of the present invention, a unitary L-shaped member 14 has a first elongated portion 14a disposed generally parallel to the heatsink surface 12s upon which device 10 is supported; a first end portion 14x, nearest an end 14b extends over device 10 and contacts the top resin-block surface 20a. A second leg portion 14c of the L-shaped member is integrally connected to elongated portion 14a, but is disposed somewhat at an angle (e.g., approximately perpendicular) thereto. Leg portion 14c has an end 14d (furthest from the unitary joint to elongated portion 14a) which is adapted to bear against heatsink 12. Member 14 further includes an aperture 14e having a fastening means 24 passing therethrough to engage a corresponding aperture 12a in heatsink 12. Once engaged, fastening means 24 exerts a force (F) on second portion 14b toward heatsink 12, causing section 14x of first portion 14a to press device 10 toward the heatsink.

An important aspect of the present invention is ensuring electrical insulation between device 10 and heatsink 12, when needed. Pad 26 ensures insulation between baseplate 16 and heatsink 12; however, there are a variety of other means for augmenting such electrical insulation. Clamp member 14 may include an optional tube 28 of any well-known insulative resin to be placed around device 10 (including the top of baseplate 16) to increase electrical isolation between device 10 and heatsink 12. If used, insulative tube 28 may optionally replace pad 26 and will form a new upper surface 28a which section 14x of first member portion 14a will contact to secure device 10 to heatsink 12. Heatsink aperture 12a may also optionally have an electrically insulative cladding 12b disposed therein, and in conjunction with insulating shim 29, will further inhibit electrical communication between fastening means 24 and heatsink 12. Additionally, clamp 14 may optionally have an elastomeric bushing 27 located between first member portion 14a and heatsink 12, such that fastening means 24 passes therethrough to provide further electrical insulation between screw 24 and heatsink 12, while at the same time providing a moisture seal.

Fastening means 24 may include any chosen one of the well-known mechanisms, such as screws, rivets, and the like, and is located between to device 10 and second member portion 14b, but not in close proximity to electrically active baseplate 16. Since section 14x contacts device surface 20a (or surface 28a) at a point approximately over chip 18, there is a generally reduced chance of any part of baseplate 16 lifting off the heatsink 12, and thus none of the thermal degradation normally associated therewith. Moreover, clamp member 14 is fabricated to allow flexing in first member portion 14a as screw means 24 is tightened. Thus, in response to the tightening of screw 24, first member portion 14a flexes inward toward heatsink 12. Because clamp 14 is fabricated from a resilient material, this inward flexing causes an outward force to be placed on the threads of screw 24 within heatsink aperture 12a, which insures that clamping pressure is maintained by "locking" the threads. Further, this thread-locking feature eliminates any necessity for other less-desirable thread-locking provisions (such as lock-nuts or lock-washers) and further ensures that the clamping pressure will not degrade even if differences in thermal expansion or material creep problems are encountered. To secure a standard TO-220 device (10) package to heatsink 12, screw 24 can be a standard 8–32 screw and, when tightened to a torque of 9 inch-pounds, may result in clamp member 14 exerting a pressure of about 300 psi between device 10 and heatsink 12.

Clamp member 14 may have a plurality of shapes and sizes, and may be fabricated from a multitude of materials, with the only limitations being that clamp member 14 exhibit sufficient strength to secure device 10 to heatsink 12, and sufficient resiliency to allow first elongated member portion 14a to flex. All such designs and materials should be understood to be within the present invention. Suitable materials for clamp 14 include titanium, aluminum, corrosion-resisting steel, carbon fiber composites, plastics, and the like. The material can be varied to suit the cost, weight, environmental and/or stiffness needs of a particular printed wiring board assembly. In one presently preferred embodiment, member 14 is fabricated from a sheet of low carbon steel (ASTM A 366) having a thickness of about 0.125 inches, with a zinc, yellow chromate finish. First member portion 14a is elongated to a length of about 1.44 inches with a width of about 0.6 inches. Second member portion 14c has a similar width and a length of about 0.24 inches. Aperture 14e has a diameter of about 0.187 inches and is located approximately 0.81 inches from first member end 14b.

Figure 1:
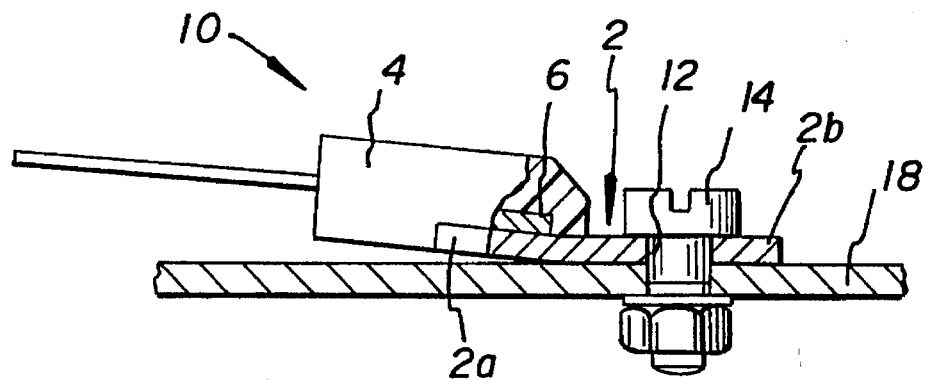
FIG. 1 is a cross-sectional view of a prior art securing mechanism for thermally securing a power supply device to a heatsink.
Figure 2:
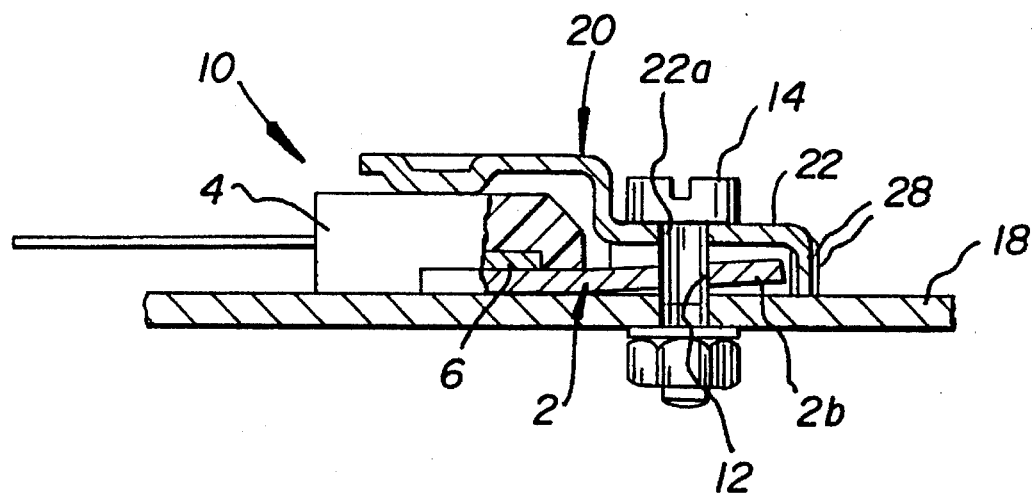
FIG. 2 is a cross-sectional view of a prior art clamp for thermally securing a power supply device to a heatsink.

As stated above, the shape, size and location of clamp 14 may change depending on the needs of the overall printed circuit board assembly design. For example, screw 24 may extend entirely through heatsink 12 and engage a nut (not shown) to secure clamp 14 to heatsink 12. Further, clamp 14 may be secured to heatsink 12 by disposing threads within first member aperture 14e, allowing screw 24 to pass from a backside 12d of heatsink 12 through clearance aperture therein, and engage the threads within aperture 14e. Such a clamping fabrication structure is shown hereinbelow (FIG. 5) for securing a plurality of devices to a common heatsink. However, it should be understood that this clamping scheme could be used to secure the single device of FIG. 3. Moreover, because clamp 14 is not limited by having to secure device 10 through the device-securing aperture in the base plate (see element 22a of Prior Art FIG. 1 ), clamp 14 may be placed in a variety of positions relative to device 10. Such placement flexibility allows the manufacture of the overall printed circuit board assembly on which device is to be mounted, to be optimized, e.g., since the placement of clamp 14 can be varied, the design of heatsink 12 can be released earlier because the heatsink design is not dependent upon the overall printed circuit layout. Thus clamp 14 allows a reduction in the number of process steps required for circuit board assembly manufacturing. Power devices 10 can be soldered to the printed wiring board without a heatsink 12 or any other fixture. Heatsink 12 and clamp member 14 can then be assembled with ease afterward because no alignment of heatsink hole to device mounting hole is necessary prior to soldering. Clamp member 14 may secure at least present standard semiconductor package types TO-220, TO218, TO-247 and D-61-6, and still fit in a typical 2 inch height envelope.

Figure 4:
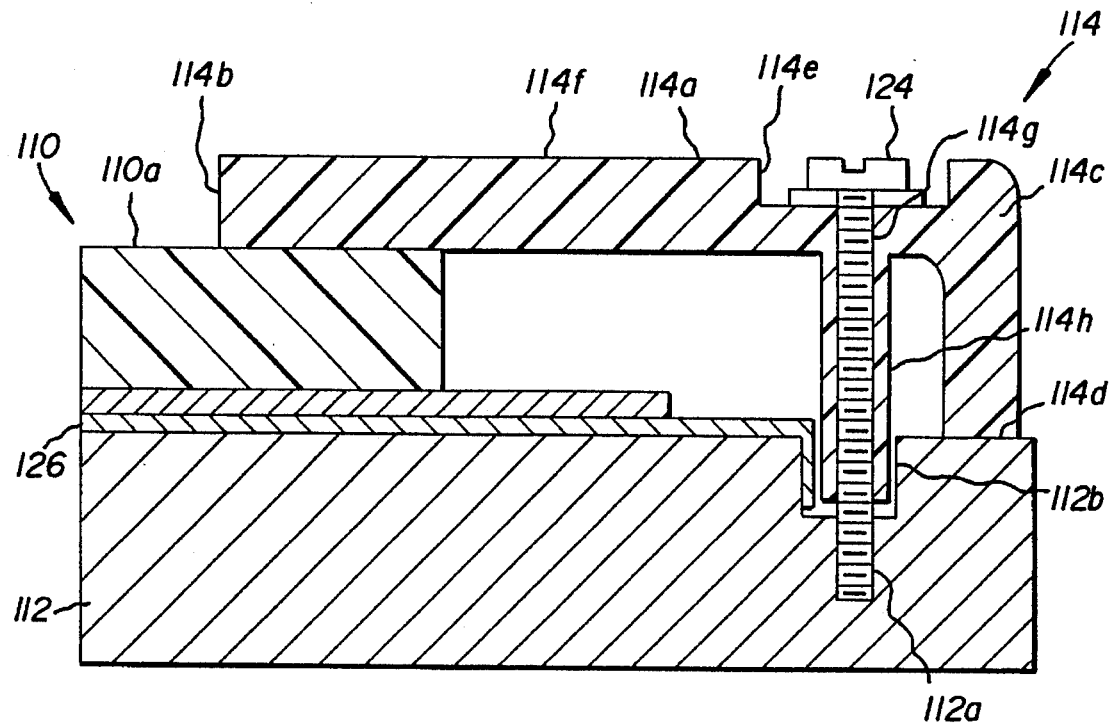
FIG. 4 is a cross-sectional view of a plastic clamp for thermally securing a power supply device to a heatsink while ensuring electrical insulation therebetween.

FIG. 4 shows one presently preferred plastic clamp member 114 for securing a device 110 to a heatsink 112. Plastic-clamp member 114 is a unitary L-shaped member having a first elongated portion 114a having a first end 114b which extends over device 110, where a surface of portion 114a contacts top surface 110a thereof, and a second portion 114c integrally connected to portion 114a and substantially perpendicular thereto. Portion 114c has an end 114d adapted to bear against heatsink 112. Additionally, plastic clamp 114 may have a notch 114e disposed into a surface 114f of first portion 114a and aligned with an aperture 114g, allowing a fastening means 124 to be flush with, or below, surface 114f when engaged with heatsink 112. Fastening means 124, e.g., a screw, engages a corresponding aperture 112a in heatsink 112. As screw 124 engages heatsink aperture 112a, second-portion end 114d bears against heatsink and first portion 114a reciprocally bears against device surface 110a, thereby securing device 110 to heatsink 112 with a thermally-conductive and electrically-insulative pad 126 disposed therebetween. Heatsink 112 also may have a notch 112b disposed therein in alignment with screw 124 and aperture 112a, and clamp 114 may optionally have an insulative tubular protrusion 114h surrounding screw 124 and in alignment therewith, extending into heatsink notch 112b. Protrusion 112h gives additional insulation between screw 124 and device 110.

Figure 5:
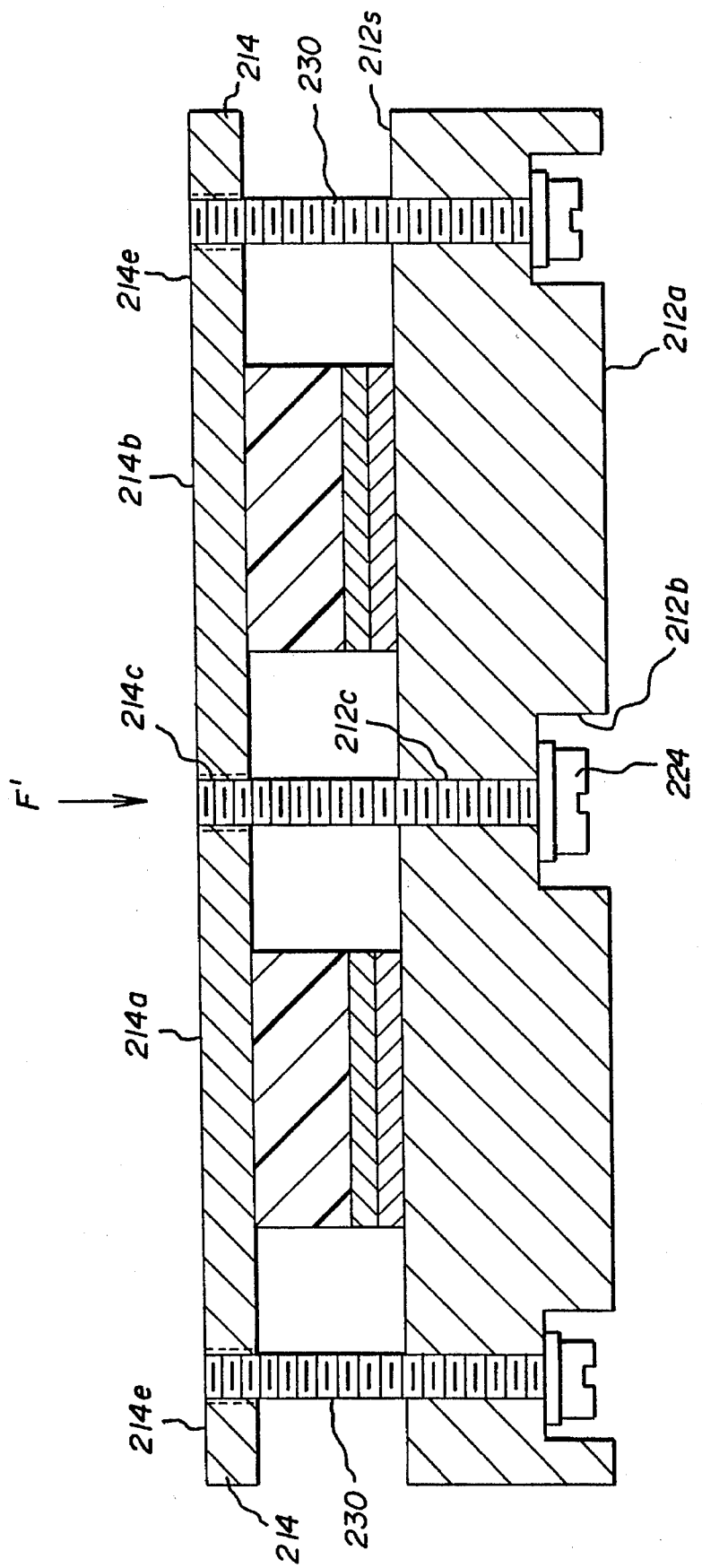
FIG. 5 is a cross-sectional view of a clamping mechanism for thermally securing a plurality of power supply devices to a con,non heatsink while ensuring electrical insulation between each device and the heatsink.

In accordance with another embodiment of the present invention, FIG. 5 shows that a plurality of devices (210a and 210b) can be secured to a common heatsink 212 with a fastening (screw) means 224 located between the plurality of devices (210a and 210b). Clamp member 214 is a unitary member which has a plurality of sections (214a and 214b) each extending over an associated portion of one of the plurality of devices (210a and 210b) and has an aperture 214c disposed in a portion which is central to the device abutment portions (214a and 214b). Heatsink 212 has a bottom surface 212a, which may have a notch 212b and corresponding aperture 212c disposed therein. Clamp-aperture 214c may be threaded to allow passage of a fastening means 224, e.g., screw, which passes through heatsink bottom surface 212a to engage threaded clamp aperture 214c. Once engaged, fastening means 224 exerts a force (F') pulling clamp 214 toward heatsink top surface 212s, thereby urging each of the plurality of devices (210a and 210b) toward heatsink 212. Although only two devices (210a and 210b) are shown, it should be understood that clamp 214 may have a plurality of appendages extending from a central portion to hold a plurality of devices to a common heatsink 212, or may have one or more extensions 214e to facilitate use of outer fastening means 230, in place of, or in conjunction with central fastening means 224.

While a presently preferred embodiment of our clamp is described herein in some detail, many modifications and variations will become apparent to those skilled in the art; it is our intent to be limited only by the scope of the appending claims, and not by the specific details or instrumentalities present herein by way of description of the preferred embodiments.

What is claimed is:

1. A clamp for securing a power-dissipating device to a heatsink, comprising:

a unitary member having a first section adapted to bear against a selected first device of a plurality of devices, and a second section adapted to bear against a selected second device of said plurality of devices; and fastening means adapted to exert a force on said member at a location between said first device and said second device, to cause said first section and said second section each to respectively urge said first device and second device firmly against said heatsink.

2. The clamp of claim 1, where said unitary member has a plurality of sections each adapted to bear against a respective one of said plurality of devices; and fastening means adapted to exert a force on said member at a location between said plurality of devices, to cause each of said sections to respectively urge each of said plurality of devices firmly against said heatsink.

3. In combination, a thermally-conductive heatsink, a power-supply device disposed on said heatsink and in thermal contact therewith, a thermally-conductive and electrically-insulative pad located between said device and said heatsink, and a unitary member securing said device to said heatsink;

said device comprising a thermally-conductive and electrically-conductive baseplate, said baseplate having a lower surface in contact with said heatsink and an upper surface supporting a semiconductor chip, with said chip and a portion of said baseplate being encased by an insulative material;

said unitary member having a first elongated portion with a section adapted to bear against said device and a second portion integrally joined with said elongated portion and having an end adapted to bear against a surface of said heatsink;

fastening means adapted to exert a force on said member at a location between said device and said second portion, to cause said bearing section to urge said device firmly against said heatsink to allow transfer of thermal energy while inhibiting electrical communication; and an elastomeric bushing disposed between said member first portion and said heatsink and with said fastening means extending through said elastomeric bushing to secure said device to said heatsink.

4. The combination of claim 3, where said unitary member is fabricated from a material selected from the group consisting of: steel, titanium, aluminum, carbon-fiber composites and plastics.

5. The combination of claim 3, where said heatsink includes a threaded aperture and where fastening means is a screw which passes through an aperture in said first elongated portion and engages said threaded-heatsink-aperture.

6. The combination of claim 3, where said heatsink includes an aperture disposed therein, where first elongated portion has a threaded aperture and where said fastening means is a screw which passes through a backside of said heatsink and engages said threaded-first-portion-aperture.

7. The combination of claim 3, where said device has an insulative resin enclosing all of said device except said heatsink-contacting lower surface of said conductive baseplate.

8. The combination of claim 5, where said member is bent, with said first portion and second portion disposed at an angle to one another.

9. The combination claim 8, where said member is L-shaped with said first portion and said second portion being substantially perpendicular.

10. In combination, a thermally conductive heatsink, a power-supply device disposed on said heatsink and in thermal contact therewith, a thermally-conductive and electrically-insulative pad located between said device and said heatsink, and a unitary member securing said device to said heatsink;

said device comprising a thermally-conductive and electrically-conductive baseplate, said baseplate having a lower surface in contact with said heatsink and an upper surface supporting a semiconductor chip, said chip and a portion of said baseplate being encased by an insulative material;

said unitary member having a first section adapted to bear against a selected first device of a plurality of devices, and a second section adapted to bear against a selected second device of said plurality of devices; and fastening means adapted to exert a force on said member at a location between said first device and said second device, to cause said first section and said second section each to respectively urge said first device and second device firmly against said heatsink to allow transfer of thermal energy while inhibiting electrical communication.

11. The combination of claim 10, where said unitary member has a plurality of sections each adapted to bear against a respective one of said plurality of devices; and fastening means adapted to exert a force on said member at a location between said plurality of devices, to cause each of said sections to respectively urge each of said plurality of devices firmly against said heatsink.

* * * * *